United States Patent [19]

Vander Mey

[11] 4,165,294

[45] Aug. 21, 1979

[54] PHENOL-FREE AND CHLORINATED HYDROCARBON-FREE PHOTORESIST STRIPPER COMPRISING SURFACTANT AND HYDROTROPIC AROMATIC SULFONIC ACIDS

[75] Inventor: John E. Vander Mey, Stirling, N.J.

[73] Assignee: Allied Chemical Corporation, Morris Township, Morris County, N.J.

[21] Appl. No.: 908,189

[22] Filed: May 22, 1978

Related U.S. Application Data

[63] Continuation-in-part of Ser. No. 740,154, Nov. 8, 1976, which is a continuation-in-part of Ser. No. 689,718, May 24, 1976, abandoned, which is a continuation of Ser. No. 601,574, Aug. 1, 1975, abandoned.

[51] Int. Cl.² .......................... C11D 3/43; B08B 3/08; C23G 5/02
[52] U.S. Cl. ........................................ 252/143; 134/3; 134/38; 134/42; 252/171; 252/558
[58] Field of Search ............... 252/142, 143, 162, 171, 252/558, 549; 134/3, 38, 40, 42

[56] References Cited

U.S. PATENT DOCUMENTS

| | | | |
|---|---|---|---|
| 2,814,593 | 11/1957 | Beiswanger et al. | 252/8.55 |
| 3,335,088 | 8/1967 | Mandell | 252/143 |
| 3,582,401 | 6/1971 | Berilla et al. | 252/143 X |
| 3,600,321 | 8/1971 | Tedeschi et al. | 252/148 |
| 3,871,929 | 3/1975 | Schevey et al. | 134/3 X |
| 3,932,130 | 1/1976 | Bennett et al. | 21/2.7 |
| 3,988,256 | 10/1976 | Vander Mey et al. | 252/171 |
| 4,070,203 | 1/1978 | Neisius et al. | 134/3 |

FOREIGN PATENT DOCUMENTS

| | | |
|---|---|---|
| 2632949 | 2/1977 | Fed. Rep. of Germany |
| 52-20101 | 2/1977 | Japan |

*Primary Examiner*—Harris A. Pitlick
*Attorney, Agent, or Firm*—Alan M. Doernberg; Jay P. Friedenson

[57] ABSTRACT

Stripping solutions, free from phenol and chlorinated hydrocarbon compounds, comprising a surfactant alkylarylsulfonic acid having 12–20 carbons, a hydrotropic aromatic sulfonic acid having 6–9 carbons and a halogen-free aromatic hydrocarbon solvent with a boiling point above 150° C. The stripping compositions effectively remove organic polymeric substances from inorganic substrates and are substantially clear water rinsable.

25 Claims, No Drawings

4,165,294

PHENOL-FREE AND CHLORINATED HYDROCARBON-FREE PHOTORESIST STRIPPER COMPRISING SURFACTANT AND HYDROTROPIC AROMATIC SULFONIC ACIDS

CROSS-REFERENCE TO RELATED APPLICATIONS

This application is a continuation-in-part of application Ser. No. 740,154, filed Nov. 8, 1976, which was a continuation-in-part of Ser. No. 689,718, filed May 24, 1976 and now abandoned, which was a continuation of application Ser. No. 601,574, filed Aug. 1, 1975 and now abandoned.

BACKGROUND OF THE INVENTION

During manufacture of semiconductors and semiconductor microcircuits, it is frequently necessary to coat the materials from which the semiconductors and microcircuits are manufactured with a polymeric organic substance, generally referred to as a photoresist, e.g., a substance which forms an etch resist upon exposure to light. These photoresists are used to protect selected areas of the surface of the substrate, e.g. silicon, $SiO_2$ or aluminum, from the action of the etching solution, while such etchant selectively attacks the unprotected area of the substrate. Following completion of the etching operation and washing away of the residual etchant, it is necessary that the resist be removed from the protective surface to permit essential finishing operations.

A common method used in removing the photoresist from the substrate is by contacting the substract with an organic stripper. Heretofore these organic strippers have been composed of various components whose purpose it was to lift and remove the polymeric photoresist from the substrate. However, these stripping solutions have heretofore usually contained phenol or phenol compounds and chlorinated hydrocarbon compounds. The use of phenol or phenol compounds or chlorinated hydrocarbon compounds results in a distinct disadvantage due to the toxicity of phenol as well as the pollution problems arising from the disposal of phenol or phenol compounds such as cresols, phenol sulfonic acid and the like or the disposal of chlorinated hydrocarbon compounds.

Phenol-free and chlorinated hydrocarbon-free strippers are described in U.S. Pat. No. 4,070,203 (issued Jan. 24, 1978 to Neisius et al.). These strippers, having only an alkylbenzenesulfonic acid component of 12–20 carbons and a chlorine-free, aromatic hydrocarbon component with a boiling point above 150° C., suffer from the disadvantage that they cannot be easily rinsed off the inorganic substrate after stripping with aqueous rinsing materials such as deionized water. Instead organic solvents are required to avoid either the polymer or the aromatic solvent precipitating or forming oil beads, respectively, or, if water is used, copious amounts are required. The formation of oil beads is called "oiling out" and may lead to an undesirable oily layer remaining on the inorganic substrate.

It is an object of this invention to provide an effective photoresist stripping solution which is essentially free of phenol, phenol compounds and chlorinated hydrocarbon compounds.

It is an additional object of this invention to provide such a solution which is substantially clean water rinsable such that the hydrocarbon solvent does not oil out and the polymer does not reprecipitate during rinsing.

It is an additional object of this invention to provide a method for removing photoresist polymeric coatings from inorganic substrates with such a stripping solution free from phenol, phenol compounds and chlorinated hydrocarbon compounds which can then be rinsed with an aqueous rinsing agent such as deionized water.

These and other objects will become apparent from the description which follows.

BRIEF DESCRIPTION OF THE INVENTION

Briefly, in accordance with this invention, there is provided a stripping solution for removing polymeric organic substances from an organic substrate, said solution being essentially free of phenol compounds and chlorinated hydrocarbon compounds and being substantially clear water rinsable and comprising (a) from about 5 to about 60 weight percent of a surfactant alkylarylsulfonic acid having 12–20 carbons;

(b) from about 15 to about 95 weight percent of a hydrotropic aromatic sulfonic acid having 6–9 carbons; and (c) from about 5 to about 40 weight percent of a halogen-free aromatic hydrocarbon solvent with a boiling point above 150° C.

Also in accordance with this invention, there is provided a method for removing a photoresist organic polymeric coating material from the surface of an inorganic substrate which comprises contacting said coated substance for a time sufficient to loosen said coating with the above stripping composition and rinsing the composition and photoresist from the substrate with an aqueous rinsing agent.

DETAILED DESCRIPTION OF THE INVENTION

The present invention provides a composition which is effective in removing photoresist, and a method for removing photoresist from inorganic substrates, without the use of phenol or phenol compounds or chlorinated hydrocarbon compounds and their corresponding disadvantages. Surprisingly, it has been found that the surfactant sulfonic acid itself acts effectively as a photoresist stripper. This is unexpected in the sense that the prior art relating to such stripping solutions employed such compounds in their compositions as surface active agents and yet felt that phenol or phenol compounds were necessary to effectively remove the photoresist from the substrate.

Certain surfactant sulfonic acids have been found to be effective, per se, for removing organic photoresist, that is, those having 12–20 carbons.

Exemplary of such aryl sulfonic acids suitable for use in accordance with the present invention are hexylbenzene sulfonic acid, heptylbenzenesulfonic acid, octylbenzenesulfonic acid, decylbenzenesulfonic acid, dodecylbenzenesulfonic acid, tridecylbenzenesulfonic acid, quadecylbenzenesulfonic acid, and the like.

Blends of these surfactant sulfonic acids may also be employed so long as the number average carbon number is between 12 and 20. Solutions containing a major proportion of higher sulfonic acid of over 15 carbons, which is particularly dodecylbenzenesulfonic acid are among the preferred blends.

The preferred surfactant sulfonic acid for use in accordance with this invention is dodecylbenzenesulfonic acid, although decylbenzenesulfonic acid has also been found to be particularly effective.

Because the viscosity of the sulfonic acids is fairly high, it is desirable to lower the viscosity to reduce the quantity of material that is taken out of the stripping solution upon removal of the substrate after treatment with the stripping solution. The viscosity of the surfactant sulfonic acid can be reduced by the addition of a hydrocarbon solvent. The solvent or solvent system which are to be used must be materials which do not deter from the stripping effectiveness of the surfactant sulfonic acid. The solvent or solvent system itself is not critical to the stripping, i.e., the function of the sulfonic acid, since the function of the solvent is merely to reduce the viscosity and to render the sulfonic acid more readily water rinsable. Of course, the solvent should be miscible with the sulfonic acid and not react therewith and the most desirable solvents are those which do not induce corrosion on materials such as aluminum. For the present invention, the solvent must not contain chlorinated hydrocarbons, phenol or phenol compounds. Within these guidelines, it has been found that solvents employed in conjunction with the surfactant sulfonic acids in accordance with this invention may be halogen free aromatic hydrocarbons having a boiling point above 150° C. Other solvents which can be used in addition to the aromatic hydrocarbon include isoparaffinic hydrocarbons with relatively high boiling points, but relatively low melting points, as are commonly produced by modern synthesis from selected petroleum derived raw materials. The isoparaffinic should be liquid or room temperature or slightly above and not boil under about 150° C. They may be straight or branched chained as long as they fall within the selected parameters. Typical isoparaffinic hydrocarbons are available under the trade name Isopar and can be generally characterized as containing about 60 percent of C-11 compounds, 20 percent of C-10 compounds and 20 percent of C-12 compounds. Preferably the isoparaffinics are present at about 2-30 weight percent paraffinic solvent by weight of aromatic hydrocarbon solvent.

Among the preferred components of the aromatic hydrocarbon solvent are alkylaryl compounds having 1-14 alkyl carbons.

Such compounds contain a benzene ring with one or more alkyl chains. Each alkyl chain may be straight or branched, but the straight-chain alkyl groups are preferred for biodegradability. Preferred examples of such compounds include toluene, xylene, ethylbenzene, trimethylbenzene, cumene, phenyl octane and dodecylbenzene. Other preferred examples include phenyl nonane, tridecylbenzene, tridecyltoluene and triethylbenzene. Mixtures of such compounds may also be used. The preferred aromatic hydrocarbon solvents are mixtures of compounds with 9-13 alkyl carbons or 15-19 total carbons. Most preferred is dodecylbenzene or mixtures having an average of about 18 total carbons.

The composition preferably contains about 5-30 weight percent aromatic hydrocarbon compound or compounds. For example, about 5-30 weight percent of the preferred aromatic hydrocarbons having 15-19 carbons or the most preferred dodecylbenzene may be used.

The composition is free of halogenated hydrocarbons such as perchloroethylene and dichlorobenzene. Such solutions are generally biodegradable as compared to solutions containing halogenated hydrocarbons.

Of course other solvents may also be used within the requirement of being free of phenol, phenol compounds and chlorinated hydrocarbon free. However, such other components are preferred only in smaller quantities than the aromatic hydrocarbon.

The present invention also includes a hydrotropic aromatic sulfonic acid of 6-9 carbons which may be benzenesulfonic acid, toluenesulfonic acid, xylenesulfonic acid, ethylbenzenesulfonic acid, methylethylbenzenesulfonic acid, trimethylbenzenesulfonic acid, propylbenzenesulfonic acid, cumenesulfonic acid or mixtures thereof. The total group of names hydrotropic sulfonic acids will sometimes be referred to herein as "hydrotropes" and the group excluding benzenesulfonic acid will be referred to as "alkylaryl hydrotropes." It should be appreciated that the alkylaryl hydrotropes have 7-9 carbons. Preferred are toluenesulfonic acid and benzenesulfonic acid, with benzenesulfonic acid being more preferred. The several alkylbenzene sulfonic acids may be one isomer such as paratoluenesulfonic acid or a mixture of isomers such as para- and orthotoluenesulfonic acid.

It has also been surprisingly found that the hydrotropic aromatic sulfonic acids are themselves effective stripping agents such that, particularly if benzenesulfonic acid is the predominant hydrotrope, a minimum of the larger surfactant alkylarylsulfonic acids are required. Thus the hydrotropic aromatic sulfonic acid may comprise from about 15 to about 95 weight percent of the total composition, preferably about 25 to about 85 weight percent of the total composition. It is also preferred that benzenesulfonic be the predominant hydrotrope, with 0 to about 10 weight percent of the total composition being at least one of the above alkylaryl hydrotropes, and the balance of the hydrotrope being benzenesulfonic acid. Especially preferred is 0 to about 10 weight percent of the composition being toluenesulfonic acid and the balance of the hydrotrope being benzenesulfonic acid.

The hydrtropic sulfonic acid should be present in sufficient amounts to prevent the aromatic hydrocarbon (if present) from oiling out on rinsing with water. Proportions within the range of about 15-55 weight percent hydrotropic sulfonic acid may not be sufficient for the several alkylbenzenesulfonic acids, even toluenesulfonic acid. Benzenesulfonic acid is normally sufficient at anywhere from about 15 to about 45 weight percent to prevent the aromatic hydrocarbon solvent from oiling out, although the lower end of this range, below about 25%, is less preferred if the solvent is over about 30% of the composition. Within these ranges, satisfactory amounts of a selected hydrotropic sulfonic acid for the selected surfactant sulfonic acid and aromatic hydrocarbon solvent can be readily determined by adding water to a sample and looking for oil droplets.

It should be appreciated that a degree of cloudiness in the water rinse is tolerable and, therefore the present invention is not limited to completely clear water rinsable strippers. Oil droplets large enough to be visually observed are intolerable, however, since they indicated a likelihood of oiling out on the substrate. Thus the present compositions should be "substantially clean water rinsable" such that a water rinse will remain clear or only turn cloudly and not form visible droplets. Preferably, however, the present compositions are "clear water rinsable" in that a water rinse remains "water white" after being used to rinse the present compositions in reasonable proportions such as ten to one hundred parts by volume of water per part of stripper that enters the rinse bath or spray.

The overall range of proportions, by weight, is about 5–60% surfactant sulfonic acid, about 15–95 weight percent hydrotropic sulfonic acid and 0 to about 40 weight percent aromatic hydrocarbon solvent. Preferably the hydrotropic sulfonic acid is benzenesulfonic acid. Preferably the surfactant is dodecylbenzenesulfonic acid. A preferred range is about 15–55% surfactant alkylarylsulfonic acid, about 25–80% hydrotropic aromatic sulfonic acid and about 5–30% aromatic hydrocarbon solvent.

Two especially preferred ranges are the following by weight percent:

|   | Surfactant | Hydrotrope | Solvent |
|---|---|---|---|
| A | about 45–55% | about 20–50% | about 5–25% |
| B | about 5–45% | about 50–85% | 0 to about 10% |

Composition A represents a highly preferred group of strippers, having (1) the larger surfactant in quantities sufficient to perform rapid and complete stripping of most photoresists and (2) hydrotrope in quantities sufficient to keep the solvent from oiling out upon rinsing. The hydrotrope in composition A probably performs only a secondary stripping role. Composition B represents a highly preferred group of strippers wherein the hydrotrope is present in quantities sufficient to perform rapid and complete stripping of most photoresists, as well as keeping the relatively low proportions of solvent from oiling out. The choice between these two types of preferred strippers may depend upon the type of photoresist and its history on the substrate (especially bake time and temperature), the permissible stripping conditions, desired physical properties of the stripper during manufacture, storage and use and other secondary factors.

The present compositions are preferably stabilized against metal corrosion by a fluoride inhibitor as described in my copending U.S. patent application Ser. No. 729,515 filed Oct. 4, 1976. Thus about 5–500 ppm fluoride is preferably present in the composition, with about 10–200 ppm fluoride being more preferred. This fluoride may be complexed as described in my copending U.S. patent application Ser. No. 873,340 filed Jan. 30, 1978 with a nitrogen-containing complexing agent such as morpholine, dimethyl formamide, aniline or the like, preferably at a molar ratio of complexing agent to fluoride between about 10:1 and about 1:10, and more preferably at such a molar ratio between about 2:1 and about 1:2. The fluoride may be inhibited from vaporizing during storage and use in other ways as well.

The present compositions are preferably substantially anhydrous to prevent metal corrosion during stripping by the combination of sulfonic acid and water; containing, for example, less than 1% water, preferably less than 0.5% water and more preferably less than 0.2% water.

The polymeric organic substances which are to be removed by the stripping solutions of this invention are photoresists which generally comprise polymers selected from relatively low molecular weight polyisoprenes, polyvinyl cinnamates and phenol formaldehyde resins. These photoresists are applied to a substrate, e.g., $SiO_2$, silicon or aluminum and portions are masked. The masked substrate is then exposed to light, e.g., a 120 volt 650 watt quartz lamp for 1–15 seconds at a distance of 6–12 inches to harden the exposed photoresist. For negative photoresists, the portion of the photoresist which is not exposed, i.e., masked from the light, is then removed by a mild solvent which does not dissolve the exposed photoresist, thus leaving a pattern, e.g., a portion of an electrical circuit pattern, on the exposed substrate. For positive photoresists it is the exposed photoresist portions that are removed. The remaining photoresist is then baked for further hardening and the portion of the substrate which is not covered by the photoresist is etched or otherwise treated. The etchant may be a buffered oxide, acid or plasma etchant which may further harden the photoresist. The hardened photoresist must then be removed before the substrate can be further processed or used. In employing the stripping solutions of this invention, the substrate covered with the baked photoresist is contacted with the stripping solution at a temperature of from about 50° to about 180° C., preferably between 90° and 120° C. Times required for stripping the photoresist vary to quite an extent, depending on the specific polymer used in the photoresist and photoresist processing conditions. Generally, the time involved will be between 1 and 10 minutes although some resists, depending upon the bake temperature, may require 15 minutes, 30 minutes or even an hour of contact with the stripping solution before the polymeric photoresist is loosened from the substrate. It should be appreciated that many photoresists are complete and dissolved off of the substrate while others may be loosened, then floated off and then dissolved in the stripping composition.

Examples of photoresists which may be stripped by the present composition are the following positive and negative resists:

| Type | Trademarks(s) | Source |
|---|---|---|
| Negative | | |
| Polyisoprene | Microneg 752 or 747 | Eastman Kodak Company |
|  | Waycoat IC or SC | Phillip A. Hunt, Inc. |
|  | Waycoat HR-100 or HR-200 | Phillip A. Hunt, Inc. |
|  | KTFR, KMER | Eastman Kodak Company |
| Polyvinyl Cinnamate | KPR | Eastman Kodak Company |
| Positive | | |
| Phenol Formaldehyde | Shipley AZ 1350 or AZ 111 | Shipley Co., Inc. |
|  | Waycoat HP-104 or HP-204 | Phillip A. Hunt, Inc. |
|  | Micropos 809 | Eastman Kodak Company |

After the photoresist has been stripped from the substrate, the substrate is rinsed in any aqueous rinsing liquid. A solvent rinse may follow the stripping step, with solvents such as butylcellusolve or methylcellusolve being used. Since, however, the present compositions are substantially clear water rinsable in that little or no oiling out of aromatic hydrocarbon or reprecipitation of polymer occurs when water alone is used, it is preferred to rinse with deionized water of the purity commonly found in semiconductor processing directly after stripping.

The compositions of the present invention, and modifications thereof can also be used to strip a variety of polymeric resins, including paints, varnishes, fluxes and the like, as well as photoresists, from a variety of inert substrates. Thus the present invention includes also a method of stripping a polymeric resin from an inert substrate which comprises contacting the substrate coated with the resin for a period of time sufficient to loosen the resin by a composition which comprises:

(a) from 0 to about 60 weight% of a surfactant alkylarylsulfonic acid having 12-20 carbons, (b) from about 20 to 100% by weight of a hydrotropic aromatic sulfonic acid having 6-9 carbons, (c) from 0 to about 20 weight% of a halogen-free aromatic hydrocarbon solvent with a boiling point above 150° C., and said composition being free of phenol compounds and chlorinated hydrocarbon compounds and being substantially clear water rinsable; and then rinsing the composition and photoresist from the substrate with an aqueous rinsing agent.

Preferred forms of such method are those wherein the polymeric resin is a polyisoprene, polyvinyl cinnamate or phenol formaldehyde photoresist. More preferred are such methods wherein the composition is of the proportions indicated by compositions "A" and "B" above.

DESCRIPTION OF THE PREFERRED EMBODIMENTS

EXAMPLES 1-32

A silicon dioxide substrate was coated with two organic photoresists, a negative resist of the polyisoprene type (Waycoat HR-100 from Phillip A. Hunt, Inc.) and a positive resist of the phenol formaldehyde type (Shipley AZ 1350 from Shipley Co., Inc.).

The positive resist was baked on each substrate at 180° C. for 30 minutes. The negative resist was baked on each substrate at 150° C. for 60 minutes. The substrates were then placed in the various stripping compositions shown in Table 1 for 1 minute and then removed and placed in a beaker of water with mild agitation. If photoresist remained on the substrate, the example was repeated at 2 minutes stripping time. If photoresist still remained on the substrate, the example was repeated at 3 minutes stripping time and so on up to 10 minutes, until no photoresist was detected on the substrate. Once stripping time was determined, the beaker of rinse water used for that run was examined and noted as "clear" if water white, "cloudy" if opague and "oily" if oil droplets or an oil layer were observed.

As Table I indicates, very effective results are achieved in employing the present compositions which are free of phenol, phenol compounds, and chlorinated hydrocarbon compounds to remove polymeric photoresist from inorganic substrates with a water rinse. In Tables 1 and 2 the following abbreviations are used:

BSA—benzenesulfonic acid obtained from Jim Walter Associates, contains about 1.0% free sulfuric acid.

DDBSA—dodecylbenzenesulfonic acid obtained from Stepan Chemical Co., contains a carbon distribution of about 18% C-16, 38% C-17, 33% C-18 and 10% C-19 and contains about 2.0% free hydrocarbon and 0.5% free sulfuric acid.

TSA—toluenesulfonic acid obtained from Jim Walters Associates, contains about 1.0% free sulfuric acid.

DDB—dodecylbenzene obtained from Stepan Chemical Co., contains a carbon distribution of about 18% C-16, 38% C-17, 33% C-18 and 10% C-19.

CSA—cumenesulfonic acid.

XSA—xylenesulfonic acid.

EBSA—ethylbenzenesulfonic acid.

HBSA—hexylbenzenesulfonic acid or sulfonic acid with average carbon number about 22.

DBSA—decylbenzenesulfonic acid or sulfonic acid with average carbon number about 16.

TDBSA—tridecylbenzenesulfonic acid or sulfonic acid with average carbon number about 19.

HDB—hexadecylbenzene or aromatic hydrocarbon with average carbon number about 12.

DB—decylbenzene or aromatic hydrocarbon with average carbon number about 16.

TDB—tridecylbenzene or aromatic hydrocarbon with average carbon number about 19.

The photoresists used, identified above by their trademarks or trade names, are believed to be as follows:

| Abbreviation | Tradename | Source | Type |
| --- | --- | --- | --- |
| 747 | MicroNeg 747 | Kodak | Polyisoprene |
| 809 | MicroPos 809 | Kodak | Phenol Formaldehyde |
| KTFR | KTFR | Kodak | Polyisoprene |
| KPR | KPR | Kodak | Polyvinyl Cinnamate |
| HR-100 | Waycoat HR-100 | Hunt | Polyisoprene |
| HP-204 | Waycoat HP-204 | Hunt | Phenol Formaldehyde |
| AZ-1350J | Shipley AZ 1350J | Shipley | Phenol Formaldehyde |

EXAMPLES 33-39

The stripping procedure of Examples 1-32 is repeated using the compositions shown in Table 2. Rapid stripping of the photoresists shown in Table 2 by each example is found with little or no oiling out or reprecipitaion of photoresist polymer.

TABLE I

| | | | | | STRIPPING TIME IN MIN AT 100° C. | | |
| --- | --- | --- | --- | --- | --- | --- | --- |
| | Weight % | | | | Positive | Negative | In |
| | BSA | DDBSA | DDB | TSA | Az1350J | HR-100 | Water |
| 1 | 22 | 52 | 26 | — | 1 | 1 | Clear |
| 2 | 21 | 49 | 30 | — | 2 | 1 | Clear |
| 3 | 20 | 46 | 34 | — | 10 | 1 | Cloudy |
| 4 | 19 | 44 | 37 | — | — | 1 | Oily |
| 5 | 26 | 49 | 25 | — | 1 | 1 | Clear |
| 6 | 30 | 46 | 24 | — | 1 | 1 | Clear |
| 7 | 33 | 44 | 23 | — | 1 | 1 | Cloudy |
| 8 | 40 | 40 | 20 | — | 1 | 1 | Cloudy |
| 9 | 25 | 62 | 13 | — | 2 | 1 | Clear |
| 10 | 35 | 65 | — | — | 2 | 1 | Clear |
| 11 | 40 | 60 | — | — | 1 | 1 | Clear |
| 12 | 32 | 57 | 11 | — | 1 | 1 | Clear |
| 13 | 30 | 60 | 10 | — | 2 | 1 | Clear |
| 14 | 39 | 48 | 13 | — | 1 | 1 | Clear |
| 15 | 41 | 45 | 14 | — | 1 | 1 | Cloudy |
| 16 | 30 | 44 | 24 | — | 1 | 1 | Clear |
| 17 | 42 | 44 | 14 | — | 1 | 1 | Cloudy |
| 18 | 40 | 40 | 20 | — | 1 | 1 | Cloudy |
| 19 | 46 | 44 | 8 | — | 1 | 1 | Clear |
| 20 | 70 | 25 | 5 | — | 1 | 1 | Clear |
| 21 | 90 | 10 | — | — | 1 | 1 | Clear |
| 22 | 85 | 10 | 5 | — | 1 | 1 | Oily |
| 23 | 19 | 68 | 13 | — | 2 | 1 | Clear |
| 24 | 10 | 75 | 15 | — | 5 | 1 | Clear |
| 25 | 39 | 48 | 13 | — | 1 | 1 | Clear |
| 26 | 70 | 25 | — | 5 | 1 | 1 | Clear |
| 27 | 45 | 45 | — | 10 | 1 | 1 | Clear |
| 28 | 20 | 55 | 25 | — | 2 | 1 | Clear |
| 29 | 100 | — | — | — | 2 | 2* | Cloudy |
| 30 | 95 | 5 | — | — | 1 | 2* | Cloudy |
| 31 | 97 | 3 | — | — | 2 | 2* | Cloudy |
| 32 | — | 70 | 30 | — | 10 | 1 | Cloudy |

*Slight residue observed on substrate

TABLE 2

| | HYDROTROPE | | SURFACTANT | | SOLVENT | | PHOTORESIST |
|---|---|---|---|---|---|---|---|
| | | % | | % | | % | % |
| 33 | BSA 70 | CSA 5 | DDBSA 25 | — | — | AZ-1350 |
| 34 | BSA 55 | TSA 5 | DDBSA 35 | DDB 5 | HR-100 |
| 35 | BSA 50 | EBSA 5 | DBSA 45 | — | — | 747 |
| 36 | BSA 80 | — | — | HBSA 20 | — | — | KPR |
| 37 | BSA 40 | — | — | TDBSA 50 | DDB 10 | HP-204 |
| 38 | BSA 30 | XSA 5 | TDBSA 50 | TDB 5 | 809 |
| 39 | BSA 35 | — | — | DDBSA 55 | HDB 10 | KTFR |

I claim:

1. A composition for stripping photoresist from an inorganic substrate comprising in combination:
   (a) from about 5 to about 60 weight percent of a surfactant alyklarylsulfonic acid having 12-20 carbons;
   (b) from about 15 to about 95 weight percent of a hydrotropic aromatic sulfonic acid having 6-9 carbons; and
   (c) from 0 to about 40 weight percent of a halogen-free aromatic hydrocarbon solvent with a boiling point above 150° C.;
said composition being free of phenol compounds and chlorinated hydrocarbon compounds and being substantially clear water rinsable.

2. The composition of claim 1 wherein said hydrotropic aromatic sulfonic acid is benzenesulfonic acid.

3. The composition of claim 2 wherein said surfactant sulfonic acid is dodecylbenzenesulfonic acid.

4. The composition of claim 1 comprising from about 15 to about 55 weight percent surfactant alkylarylsulfonic acid, from about 25 to about 80 weight percent hydrotropic aromatic sulfonic acid and from about 5 to about 30 weight percent halogen-free aromatic hydrocarbon solvent.

5. The composition of claim 4 wherein said surfactant sulfonic acid is dodecylbenzenesulfonic acid.

6. The composition of claim 1 comprising from about 45 to about 55 weight percent surfactant alkylarylsulfonic acid, from about 20 to about 50 weight percent hydrotropic aromatic sulfonic acid and from about 5 to about 25 weight percent halogen-free aromatic hydrocarbon solvent.

7. The composition of claim 1 comprising from about 5 to about 45 weight percent surfactant alkylarylsulfonic acid, from about 50 to about 85 weight percent hydrotropic aromatic sulfonic acid and 0 to about 10 weight percent halogen-free aromatic hydrocarbon solvent.

8. The composition of claim 1 wherein said hydrotropic aromatic sulfonic acid consists of benzenesulfonic acid and 0 to about 10 weight percent, by weight of composition, of at least one alkylarylsulfonic acid of 7-9 carbons.

9. The composition of claim 8 wherein said hydrotropic aromatic sulfonic acid consists of benzenesulfonic acid and toluene sulfonic acid.

10. The composition of claim 1 wherein said halogen-free aromatic solvent includes alkylaryl compounds having a number average carbon number between 15 and 19.

11. The composition of claim 1 further comprising 2-30% paraffinic solvent by weight of halogen-free aromatic hydrocarbon solvent.

12. The composition of claim 1 further comprising about 5 to about 500 ppm of fluoride ion as stabilizer.

13. The composition of claim 12 wherein the fluoride is introduced as a complex of HF and a nitrogen-containing complexing agent.

14. A method of stripping a photoresist from an inert substrate which comprises contacting the substrate coated with photoresist by the composition of claim 1 for a period of time sufficient to loosen the photoresist and rinsing the composition and photoresist from the substrate with an aqueous rinsing agent.

15. The method of claim 14 wherein said aqueous rinsing agent is deionized water.

16. A method of stripping a photoresist from an inert substrate which comprises contacting the substrate coated with photoresist by the composition of claim 2 for a period of time sufficient to loosen the photoresist and rinsing the composition and photoresist from the substrate with an aqueous rinsing agent.

17. A method of stripping a photoresist from an inert substrate which comprises contacting the substrate coated with photoresist by the composition of claim 3 for a period of time sufficient to loosen the photoresist and rinsing the composition and photoresist from the substrate with an aqueous rinsing agent.

18. A method of stripping a photoresist from an inert substrate which comprises contacting the substrate coated with photoresist by the composition of claim 6 for a period of time sufficient to loosen the photoresist and rinsing the composition and photoresist from the substrate with an aqueous rinsing agent.

19. A method of stripping a photoresist from an inert substrate which comprises contacting the substrate coated with photoresist by the composition of claim 7 for a period of time sufficient to loosen the photoresist and rinsing the composition and photoresist from the substrate with an aqueous rinsing agent.

20. A method of stripping a photoresist from an inert substrate which comprises contacting the substrate coated with photoresist by the composition of claim 8 for a period of time sufficient to loosen the photoresist and rinsing the composition and photoresist from the substrate with an aqueous rinsing agent.

21. A method of stripping a photoresist from an inert substrate which comprises contacting the substrate coated with photoresist by the composition of claim 11 for a period of time sufficient to loosen the photoresist and rinsing the composition and photoresist from the substrate with an aqueous rinsing agent.

22. A method of stripping a photoresist from an inert substrate which comprises contacting the substrate coated with photoresist by the composition of claim 12 for a period of time sufficient to loosen the photoresist and rinsing the composition and photoresist from the substrate with an aqueous rinsing agent.

23. The method of claim 14 wherein said polymeric resin is a photoresist selected from the group consisting of polyisoprene, polyvinyl cinnamate and phenol formaldehyde photoresists.

24. The method of claim 23 wherein said composition comprises from about 45 to about 55 weight percent surfactant alkylarylsulfonic acid, from about 20 to about 50 weight percent hydrotropic aromatic sulfonic acid and from about 5 to about 25 weight percent halogen-free aromatic hydrocarbon solvent.

25. The method of claim 23 wherein said composition comprises from about 5 to about 45 weight percent surfactant alkylarylsulfonic acid, from about 50 to about 85 weight percent hydrotropic aromatic sulfonic acid and 0 to about 10 weight percent halogen-free aromatic hydrocarbon solvent.

* * * * *